US011228276B1

(12) United States Patent
Elseddawy et al.

(10) Patent No.: US 11,228,276 B1
(45) Date of Patent: Jan. 18, 2022

(54) ULTRASOUND CLEANING SYSTEM FOR SOLAR PANELS

(71) Applicant: King Abdulaziz University, Jeddah (SA)

(72) Inventors: Ahmed Elseddawy, Jeddah (SA); Hatem Sindi, Jeddah (SA); Maher Azzouz, Jeddah (SA)

(73) Assignee: KING ABDULAZIZ UNIVERSITY, Jeddah (SA)

( * ) Notice: Subject to any disclaimer, the term of this patent is extended or adjusted under 35 U.S.C. 154(b) by 0 days.

(21) Appl. No.: 17/385,975

(22) Filed: Jul. 27, 2021

(51) Int. Cl.
*H02S 10/40* (2014.01)
*H02S 40/10* (2014.01)
*B81B 3/00* (2006.01)
*B08B 3/12* (2006.01)

(52) U.S. Cl.
CPC .......... *H02S 40/10* (2014.12); *B08B 3/12* (2013.01); *B81B 3/0021* (2013.01)

(58) Field of Classification Search
CPC .......... H02S 40/10; B08B 3/12; B81B 3/0021
See application file for complete search history.

(56) References Cited

U.S. PATENT DOCUMENTS

| 6,890,390 B2* | 5/2005 | Azar | B08B 3/12 134/1 |
| 2007/0227574 A1* | 10/2007 | Cart | F24S 30/452 136/206 |
| 2010/0042389 A1* | 2/2010 | Farruggia | G02B 27/0006 703/6 |

(Continued)

FOREIGN PATENT DOCUMENTS

| WO | WO-2010021405 A1 * | 2/2010 | ....... H01L 21/67051 |
| WO | WO-2019020857 A1 * | 1/2019 | .............. B08B 3/12 |
| WO | WO-2019205568 A1 * | 10/2019 | .............. F24S 40/20 |

OTHER PUBLICATIONS

IK4-Tekniker, "Ultrasonic technology to clean solar panels". Press Release, Sep. 20, 2017, www.tekniker.es.

(Continued)

*Primary Examiner* — Alexander Markoff
(74) *Attorney, Agent, or Firm* — W&C IP

(57) ABSTRACT

A system for ultrasonic cleaning of a solar panel includes a plurality of microelectromechanical systems (MEMS) ultrasonic transducers arranged on a side wall of the solar panel and/or under transparent glass on a surface of the solar panel; a hydraulic sun tracking mechanism configured to move the solar panel into a plurality of positions; a valve connected to a water source; and a controller which controls the plurality MEMS ultrasonic transducers, the sun tracking mechanism, and the valve, wherein the controller is configured to activate a cleaning protocol comprising the steps of moving the solar panel into a substantially horizontal position; opening the valve to allow a water flow over the surface of the solar panel; activating the plurality of MEMS ultrasonic transducers to apply ultrasonic waves to the water on the surface of the solar panel, wherein signal interference from different transducers are controlled to generate a rotating focused ultrasound signal over the surface of the solar panel; and moving the solar panel into a tilted position to allow the water to drain from the surface of the solar panel.

3 Claims, 2 Drawing Sheets

(56) References Cited

U.S. PATENT DOCUMENTS

| | | | | |
|---|---|---|---|---|
| 2012/0285516 | A1* | 11/2012 | Mckarris | H02S 20/00 |
| | | | | 136/251 |
| 2013/0086761 | A1* | 4/2013 | Singh | F24S 40/20 |
| | | | | 15/77 |
| 2018/0175786 | A1* | 6/2018 | Iyer | H02S 40/12 |
| 2018/0309043 | A1* | 10/2018 | Kobrin | H01L 41/081 |
| 2021/0249992 | A1* | 8/2021 | Rochman | B08B 13/00 |

OTHER PUBLICATIONS

Vasiljev et al., "Ultrasonic system for solar panel cleaning", Sensors and Actuators A 200 (2013) 74-78.

* cited by examiner

ULTRASOUND CLEANING SYSTEM FOR SOLAR PANELS

FIELD OF THE INVENTION

The invention is generally related to a solar panel ultrasound cleaning system integrated with a solar tracking system.

BACKGROUND OF THE INVENTION

Renewable energy efficiency research studies, including the improvement of greenhouse gas reduction, have been a core stone of many research foundations in the past decades [1]. Harvesting solar energy via different methods is the number one promising renewable energy source; the amount of solar energy that reaches earth per hour is more than what is consumed over an entire year by various activities [2]. Solar cells convert sunlight into electric energy; hence more sunlight absorbed more energy produced [3]. There are several methods for increasing the efficiency of the solar cell, including enhancing the absorption is efficiency via chemical methods, cooling the photovoltaic (PV) panel to reduce heat waste, sun-tracking methods for a better angle of contact, and removing obstacles between sunlight and the solar panels [4]. Dust removal, especially fine dust in sand areas, is considered the main challenge to harvesting solar energy; many approaches have been developed in order to overcome the problem via self-cleaning anti-reflective technologies [5].

Solar cell cleaning technologies for enhancing sunlight absorption is the subject of ongoing research in many countries [5-6]. Different approaches have been taken in order to achieve a clean and clear surface of the solar panel. Some of these approaches include natural dust removal via wind or rain, self-cleaning coatings to prevent dust stuck on the PV panel, electrostatic removal, and mechanical removal via vibration methods or moving the PV panel into the vertical position [6-7]. Achieving a thin layer coating of the anti-reflection self-cleaning layer is considered a challenge in terms of deposition technology and cost efficiency to apply on a large-scale solar plant. On the other hand, the green technologies of integrated electronics and bio-based material have shown great potential in terms of replacing novel material and achieving low-cost commercialized PV devices [8-9]. The need to develop a cost and energy-efficient dust removal system is increasing significantly. Such a system is required to be easily applied on a large scale solar plant and deal with heavy and fine dust removal, especially since most of the candidate areas to harvest solar energy are found in sand environments, which make dust removal via the conventional method that includes labor very hard to obtain without noticeable cost increase. In addition, the effectiveness of any applied technology for dust removal must be considered when it is compared to current methods. Although some approaches are cost-efficient, they do not achieve satisfactory results of dust removal, which affects PV power efficiency.

SUMMARY

Described herein is an automated ultrasound self-cleaning system for solar panels that utilizes a sun-tracking technology for maximum efficiency of PV panels.

An aspect of the disclosure provides a system for ultrasonic cleaning of a solar panel, comprising a plurality of microelectromechanical systems (MEMS) ultrasonic transducers arranged on a side wall of the solar panel and/or under transparent glass on a surface of the solar panel; a hydraulic sun tracking mechanism configured to move the solar panel into various positions; a valve connected to a water source; and a controller which controls the plurality MEMS ultrasonic transducers, the sun tracking mechanism, and the valve, wherein the controller is configured to activate a cleaning protocol comprising the steps of moving the solar panel into a substantially horizontal position; opening the valve to allow a water flow over the surface of the solar panel; activating the plurality of MEMS ultrasonic transducers to apply ultrasonic waves to the water on the surface of the solar panel, wherein signal interference from different transducers are controlled to generate a rotating focused ultrasound signal over the surface of the solar panel; and moving the solar panel into a tilted position to allow the water to drain from the surface of the solar panel.

In some embodiments, the water on the surface of the solar panel has a height of 0.5-5 cm during the activating step. In some embodiments, the MEMS ultrasonic transducers emits ultrasonic waves at a frequency of 20-40 kHz during the activating step.

Another aspect of the disclosure provides a method for ultrasonic cleaning of a solar panel, comprising moving the solar panel into a substantially horizontal position; opening a valve to allow a water flow over a surface of the solar panel; activating a plurality of MEMS ultrasonic transducers to apply ultrasonic waves to the water on the surface of the solar panel, wherein signal interference from different transducers are controlled to generate a rotating focused ultrasound signal over the surface of the solar panel; and moving the solar panel into a tilted position to allow the water to drain from the surface of the solar panel.

DETAILED DESCRIPTION

Embodiments of the disclosure provide an integrated solar panel cleaning system utilizing both an ultrasonic bath on a thin layer of water and a hydraulic solar tracking mechanism to control the movement of the solar panel. The integrated system uses a co-dependent functionality to optimize the system via reducing power consumption and increasing system effectiveness. The solar tracking mechanism is used to move the panel to any required position, including a horizontal position where a water bath could be created via a hydraulic valve and managed to a certain level to apply ultrasonic cleaning over the surface of the horizontally positioned solar panel. The tracking mechanism is then used to clear the panel of water via gravity and adjustment of the hydraulic valve to guide the dusted water through filters then to a tank for reuse in subsequent cleaning cycles.

As used herein, a "solar panel", or "photo-voltaic (PV) module", is an assembly of photo-voltaic cells mounted in a framework. Solar panels use sunlight as a source of energy to generate direct current electricity. A collection of PV modules is called a PV panel.

Figure 1:
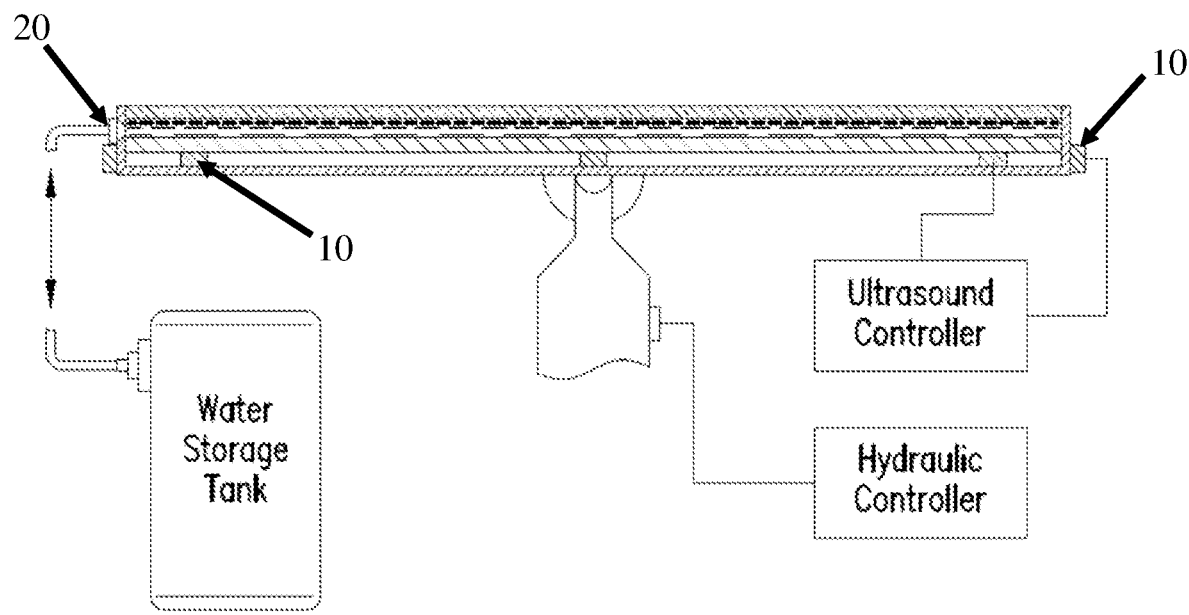
FIG. 1 is a side view of a solar panel cleaning system in a horizontal position according to some embodiments of the disclosure.

With reference to FIG. 1, the system includes two or more ultrasonic transducers 10, e.g. 2-10 transducers, arranged on a side wall of the solar panel and/or under transparent glass on a surface of the solar panel since it has no effect on the process of the absorption layer.

Ultrasonic transducers convert AC into ultrasound, as well as the reverse. Ultrasonics, typically refers to piezoelectric transducers or capacitive transducers. Piezoelectric crystals (e.g. made with lead zirconate titanate (PZT), barium titanate, etc.), change size and shape when a voltage is applied; AC voltage makes them oscillate at the same frequency and produce ultrasonic sound. Capacitive transducers use electrostatic fields between a conductive diaphragm and a backing plate. The beam pattern of a transducer can be determined by the active transducer area and shape, the ultrasound wavelength, and the sound velocity of the propagation medium. Ultrasound transmitters can also use non-piezoelectric principles, such as magnetostriction. Materials with this property change size slightly when exposed to a magnetic field, and make practical transducers.

In some embodiments, the transducer is a micro-machined ultrasonic transducers (MUTs). These devices are fabricated using silicon micro-machining technology (also referred to as microelectromechanical systems (MEMS) technology), which is particularly useful for the fabrication of transducer arrays. MEMS are made up of components between 1 and 100 micrometers in size (i.e., 0.001 to 0.1 mm), and MEMS devices generally range in size from 20 micrometres to a millimeter (i.e., 0.02 to 1.0 mm). An ultrasound MEMS transducer array uses lower power and produces a more reliable ultrasound cleaning system. In some embodiments, a string of such an array is utilized for additional advantages including easy placement over any solar panel system, lower technology price, lower power consumption and better signal/pressure control. The MEMS transducer array provides a significant increase in the system's overall efficiency and effectiveness.

Ultrasonic cleaning uses cavitation bubbles induced by high frequency pressure (sound) waves to agitate a liquid. The agitation produces high forces on contaminants adhering to substrates like metals, plastics, glass, rubber, and ceramics. This action also penetrates blind holes, cracks, and recesses. The cleaning process can thoroughly remove all traces of contamination tightly adhering or embedded onto solid surfaces. Water and/or solvents, such as water-based solvents, can be used, depending on the type of contamination. Contaminants can include dust, dirt, oil, pigments, rust, grease, algae, fungus, bacteria, lime scale, polishing compounds, flux agents, fingerprints, etc.

The ultrasonic cleaning process disclosed herein generally uses a frequency of 20-100 kHz, e.g. 40-60 kHz to agitate a fluid. The transducers produce ultrasonic waves in the fluid by changing size in concert with an electrical signal oscillating at ultrasonic frequency. This creates compression waves in the liquid which 'tear' the liquid apart, leaving behind many millions of microscopic voids/partial vacuum bubbles (cavitation). These bubbles collapse with enormous energy; temperatures and pressures on the order of 5,000 K and 135 MPa are achieved; however, they are so small that they do no more than clean and remove surface dirt and contaminants. The higher the frequency, the smaller the nodes between the cavitation points, which allows for cleaning of more intricate detail.

Solar tracking mechanisms are used in combination with ultrasonic cleaning to provide a more efficient process. Solar tracking mechanisms/systems are known in the art and include one-axis and two-axis systems and may perform either polar (equatorial) tracking or azimuth/elevation (altitude-azimuth) tracking. The solar tracking system keeps the solar panels in an optimum position perpendicular to the solar radiation during daylight hours, increasing the collected energy. An overview of suitable solar tracking systems is provided in Mousazadeh et al. "A review of principle and sun-tracking methods for maximizing solar systems output." *Renewable and sustainable energy reviews* 13, no. 8 (2009): 1800-1818.

Methods of sun-tracking may involve light-sensing devices, one or more moving motors, continuous or stepwise movement, and orientation adjustment systems. Sun tracking systems requires flexible movement of the solar panel; hence many solar panels have joints with a vertically installed rod to allow movement along the sun-tracking path. Normally, a motor driver provides a rotation motion along the panel axis to allow rotation along with the sun path or following the sun tracking sensor. Some systems include a linear actuator that provides rotation motion around a fixed movement joint on the panel. The motion is controlled via an impeded or separated motion signal control system. Although the cleaning system described herein requires two types of motion to obtain both rotation and axial movement, this can be easily obtained by a linear actuator, either electrical or hydraulic, along an angled axis on the vertical level.

The cleaning system described herein can be applied on a large scale or on single panels. It may be controlled via a common control unit or via multiple single-yet connected-controlled units for each panel. The cleaning cycle may be scheduled for required frequent cleaning or manually activated after a certain condition such as a sandstorm or heatwave since the hydraulic system could also be used as a cooling system.

Figure 3:
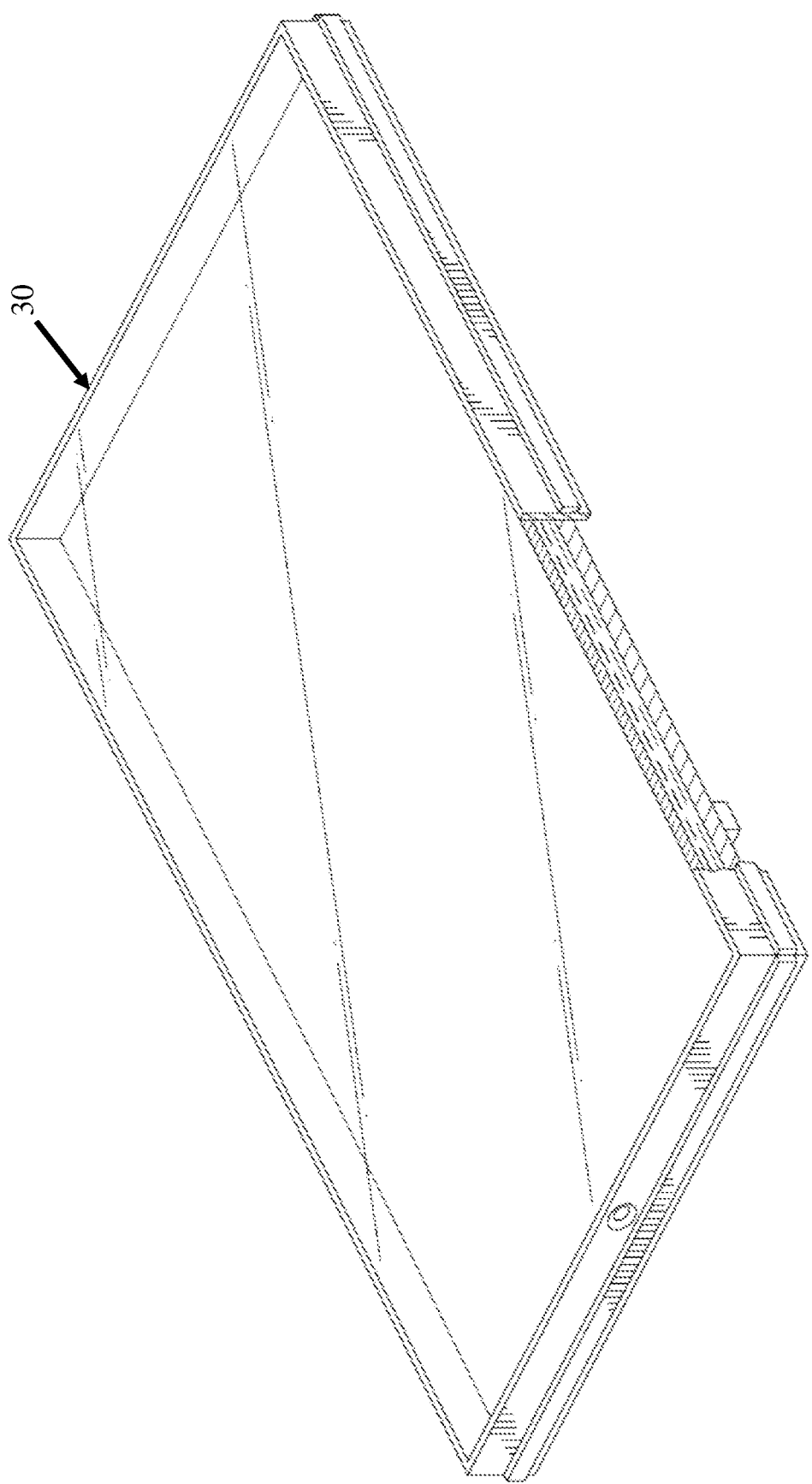
FIG. 3 is a top view of a solar panel according to some embodiments of the disclosure.

When the cleaning cycle is activated as scheduled or manually, the sun tracking mechanism, which may be an electrical or hydraulic mechanism, signals to activate an actuator to move the panel into a substantially horizontal position. A signal acknowledges the position is set to activate a hydraulic valve 20 to allow water flow over the walled panel surface. The water level may be controlled via a safety sensor to avoid water overflow to the land. With reference to FIG. 3, an extra wall 30 may be added to each side of the solar panel to maintain a water bath. For example, the wall may be 2-7 cm in height to maintain a water bath layer of 0.5 to 5 cm. Ultrasonic transducers are then activated and apply ultrasonic waves on the water bath removing all stuck dust and other contaminants from the surface of the panel to the surface of the water. The amount of time required for cleaning may be controlled via a timer based on the condition of the panel before the cleaning process starts. The more time spent, the cleaner the surface. In case of heavy dust accumulated on the surface, the complete cycle could be repeated more than one time as needed.

Figure 2:
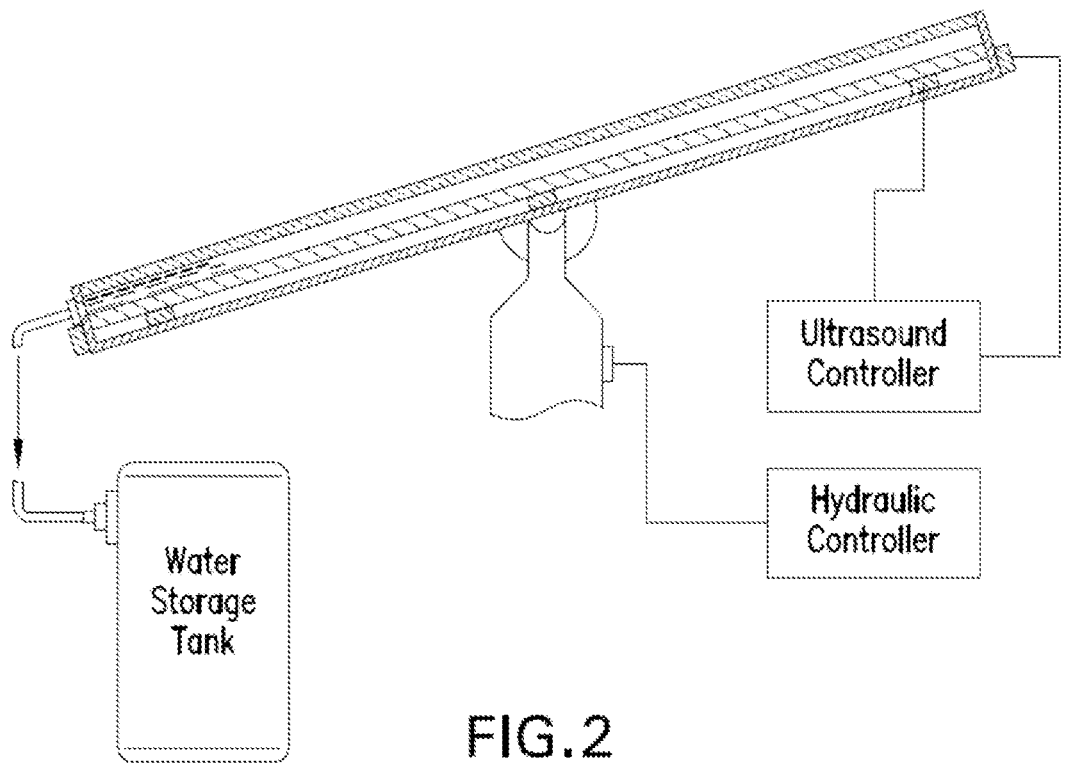
FIG. 2 is a side view of a solar panel cleaning system in a tilted position according to some embodiments of the disclosure.

At the end of a cleaning cycle, a timed hydraulic or electrical signal is sent in order to move the panel into a tilted or substantially vertical position to allow the water to flow to the bottom of the panel then to the pipe system through a hydraulic controlled valve for water filtering and storage in a tank for the next cleaning cycle (FIG. 2). The hydraulic system, which includes a pump, pipes, control valves, the tank, and filters, could include a hydraulic actuator such as a hydraulic motor or a hydraulic cylinder that could be used for both systems of sun-tracking and self-cleaning system. The hydraulic system is powerful enough not only to move one panel, but a hydraulic actuator could be used to move several panels at the same time. For the optimal use of the hydraulic system, it could also use one pump to alternate between different panels of different timed cleaning cycle across a large-scale solar harvesting plant.

The term "substantially", such as "substantially horizontal" or "substantially vertical," as used in this disclosure, refers to exactly horizontal or vertical and/or one or more deviations from exactly horizontal or vertical that do not significantly impact functions described herein, i.e. maintenance of a thin layer of water for "substantially horizontal" or the drainage of water from the panel surface at "substantially vertical". In some embodiments, "substantially" encompasses +/−100 of variation. In some embodiments, "substantially vertical" simply refers to a raised, tilted, non-horizontal position, such that gravity provides for the drainage of water from the surface of the panel.

In a system as described herein, a solar panel may be connected to a vertical column—i.e., taller than the panel length-via a universal joint from the middle bottom back part to avoid jamming into the ground. A linear actuator is connected to the panel via a joint on the top cornerback part. When the linear actuator is fully extended, the panel will be vertically facing east, where the sun rises. As the sun tracking system with controlled stepped motion retracts the linear actuator in the opposite direction, it will cause the rotational motion of the panel along the axis connecting the two joints. The fully retracting actuator will leave the panel in an almost vertical position facing the west. At night—provided a scheduled cleaning cycle or a manually activated cycle—the cleaning cycle starts by signaling the actuator to half the extended position. This will position the panel horizontally. A motion sensor or position sensor along the linear actuator could acknowledge the position of the panel, which can be either fully extended (facing east), halfway (horizontal panel), or fully retracted (facing west).

Once the panel is in the horizontal position, the hydraulic valve (5/2 or 3/2) would be signaled to open, resulting in filling the walled panel with water or cleaning solvent. A level sensor mounted on the wall of the panel may act as a safety sensor to avoid water overflow. The level sensor overflow action would be opening a safety valve, releasing the extra solvent to the piping system below the panel or the tank. Ultrasonic transducers mounted either below the glass surface of the panel or mounted at the side walls—can be powered separately—and are activated to start the timed ultrasonic cleaning process. Ultrasonic cleaning power and time required will be determined mainly by the size of the panel and the pre-cleaning condition, which may also vary not only based on the environment but also on the weather condition.

Once the cleaning time is over, the water flow will stop and revert through the valve so that water could go back to the tank through the piping system. In order to help water flow through the piping system, a cone-shaped pipe may be mounted at the bottom middle walled part of the panel. The cleaning cycle end signal will also activate the linear actuator to make a slow movement towards a full extension position. This added movement will help wash out the water and dust from the surface of the panel using gravity since the panel will be moving toward the vertical position. The washed water could be pumped through pipes (suction action) towards the filtering system to remove all dust from the water and clear it for the next cleaning cycle. The panel movement toward the vertical position may also be accompanied by extra vibration from ultrasonic-if mounted below the surface—or small motor to help remove any remaining dust via mechanical vibration.

The substantially vertical position once reached, i.e., determined by the position of the motion sensor, will also acknowledge a clean, water-free, and cooled PV surface since all the water or solvent would be pushed down and washed out via gravity to the tank through the cone-shaped pipe. The cleaning system may be operated overnight to avoid water evaporation and to avoid wasting harvesting energy because of the cleaning process during the daytime. Thus, at the beginning of each day, the clear and clean solar panel is at a vertical position facing the east, waiting for the first sunlight to start the harvesting process.

The integration of a solar tracking system with an ultrasound cleaning system increases the efficiency of both by reducing consumable power. Integrating the systems in a hydraulic way gives the resulting system max efficiency and durability advantages since the significantly lower power consumption in the cleaning process will result in much higher power production efficiency.

In some embodiments, the system employs a rotating focused ultrasound signal, e.g. via a computer-implemented method, to cover the cleaning areas increasing the ultrasound cleaning effectiveness and efficiency. A focused ultrasound signal can be obtained via controlling the combinations of the signal interference from different transducers. This may be achieved via software control of the synchronized signal from different transducers in the transducer array to generate a rotating focused ultrasound signal over the cleaning surface. Focused signals have a higher pressure hence, higher cleaning over the focused signal spots. Normally dust distribution is not equal over the entire surface and thus it does not require equal pressure to be removed. A controlled focused signal would allow focusing on the spots that require higher pressure that may be changed based on requirements if necessary.

Changing the intensity of ultrasound concentration uses less power and increases cleaning efficiency which results in optimization of the ultrasound cleaning system.

An array of transducer elements can be used to direct ultrasonic energy to a localized area on a substrate surface. Specifically, the phases of the electrical signals driving each transducer element can be selectively delayed to cause a localized area on the substrate surface to receive relatively intense ultrasonic energy while surrounding areas on the substrate surface receive significantly less ultrasonic energy. The localized region of intense ultrasonic energy is a result of interference (constructive and destructive) between the ultrasonic waves generated by the transducer elements. By adjusting the phase delays over time, the region of intense ultrasonic energy can be electronically scanned through space.

The cleaning system described herein can be added to a live-working system. In other words, it can be a standalone cleaning that does not require any additional system adjustment to be installed over current systems. The integration between solar tracking and the ultrasonic cleaning system avoids any adjustment as would be needed in cleaning only or tracking only systems.

Before exemplary embodiments of the present invention are described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

While the invention has been described in terms of its preferred embodiments, those skilled in the art will recognize that the invention can be practiced with modification within the spirit and scope of the appended claims. Accordingly, the present invention should not be limited to the embodiments as described above, but should further include all modifications and equivalents thereof within the spirit and scope of the description provided herein.

REFERENCES

[1] Tateishi, Henrique Ryosuke, Cassiano Bragagnolo, and Rosane Nunes de Faria. "Economic and environmental efficiencies of greenhouse gases' emissions under institutional influence." *Technological Forecasting and Social Change* 161 (2020): 120321.

[2] Lewis, Nathan S., and Daniel G. Nocera. "Powering the planet: Chemical challenges in solar energy utilization." *Proceedings of the National Academy of Sciences* 103, no. 43 (2006): 15729-15735.

[3] Spinelli, Pierpaolo, V. E. Ferry, J. Van de Groep, M. Van Lare, M. A. Verschuuren, R. E. I. Schropp, H. A. Atwater, and A. Polman. "Plasmonic light trapping in thin-film Si solar cells." *Journal of Optics* 14, no. 2 (2012): 024002.

[4] Zhang, Chunxiao, Chao Shen, Shen Wei, Yuan Wang, Guoquan Lv, and Cheng Sun. "A review on recent development of cooling technologies for photovoltaic modules." *Journal of Thermal Science* (2020): 1-21.

[5] Sarkin. Ali Samet, Nazmi Ekren, and Şafak Sağlam. "A review of anti-reflection and self-cleaning coatings on photovoltaic panels." *Solar Energy* 199 (2020): 63-73.

[6] He, Gaofa, Chuande Zhou, and Zelun Li. "Review of self-cleaning method for solar cell array." *Procedia Engineering* 16 (2011): 640-645.

[7] Sutha, S., Sisira Suresh, Baldev Raj, and K. R. Ravi. "Transparent alumina based superhydrophobic self-cleaning coatings for solar cell cover glass applications." *Solar Energy is Materials and Solar Cells* 165 (2017): 128-137.

[8] Kim, Jae Ho, Soon Kyu Hong, Seok-Ju Yoo, Chae Young Woo, Jin Woo Choi, Daseul Lee, Jae-Wook Kang, Hyung Woo Lee, and Myungkwan Song. "Pt-free, Cost-Effective and Efficient Counter Electrode with Carbon Nanotube Yarn for Solid-State Fiber Dye-Sensitized Solar Cells." *Dyes and Pigments* (2020): 108855.

[9] Välimäki. Marja K., Laura I. Sokka, Heidi B. Peltola, Sami S. Ihme, Teijo M J Rokkonen, Timo J. Kurkela, Jyrki T. Ollila, Arttu T. Korhonen, and Jukka T. Hast. "Printed and hybrid integrated electronics using bio-based and recycled materials—increasing sustainability with greener materials and technologies." *The International Journal of Advanced Manufacturing Technology* (2020): 1-15.

[10] Deb, Dipankar, and Nisarg L. Brahmbhatt. "Review of yield increase of solar panels through soiling prevention, and a proposed water-free automated cleaning solution." *Renewable and Sustainable Energy Reviews* 82 (2018): 3306-3313.

[11] Deutsche Gesellschaft für Sonnenenergie (DGS). *Planning and installing photovoltaic systems: a guide for installers, architects and engineers.* Routledge, 2013.

[12] Mani, M. and Pillai, R., 2010. Impact of dust on solar photovoltaic (PV) performance: Research status, challenges and recommendations. *Renewable and sustainable energy reviews,* 14(9), pp. 3124-b 3131.

[13] Williams, R. B., Tanimoto, R., Simonyan, A. and Fuerstenau, S., 2007. Vibration characterization of self-cleaning solar panels with piezoceramic actuation. In 48*th AIAA/ASMF/ASCE/AHS/ASC Structures. Structural Dynamics, and Materials Conference* (p. 1746).

[14] Chen, Dong, Sanjay K. Sharma, and Ackmez Mudhoo, eds. *Handbook on applications of ultrasound: sonochemistry for sustainability.* CRC press, 2011.

[15] Farmer. A. D., A. F. Collings, and G. J. Jameson. "Effect of ultrasound on surface cleaning of silica particles." *International Journal of Mineral Processing* 60, no. 2 (2000): 101-113.

[16] Mason, Timothy J. "Ultrasonic cleaning: An historical perspective." *Ultrasonics sonochemistry* 29 (2016): 519-523.

[17] Mousazadeh, Hossein. Alireza Keyhani, Arzhang Javadi, Hossein Mobli, Karen Abrinia, and Ahmad Sharifi. "A review of principle and sun-tracking methods for maximizing solar systems output." *Renewable and sustainable energy reviews* 13, no. 8 (2009): 1800-1818.

We claim:

1. A system for ultrasonic cleaning of a solar panel, comprising:

a plurality of microelectromechanical systems (MEMS) ultrasonic transducers arranged on a side wall of the solar panel and/or under transparent glass on a surface of the solar panel;

a hydraulic sun tracking mechanism configured to move the solar panel into a plurality of positions;

a valve connected to a water source; and a controller which controls the plurality MEMS ultrasonic transducers, the sun tracking mechanism, and the valve, wherein the controller is configured to activate a cleaning protocol comprising the steps of moving the solar panel into a substantially horizontal position;

opening the valve to allow a water flow over the surface of the solar panel;

activating the plurality of MEMS ultrasonic transducers to apply ultrasonic waves to the water on the surface of the solar panel, wherein signal interference from different transducers are controlled to generate a rotating focused ultrasound signal over the surface of the solar panel; and moving the solar panel into a tilted position to allow the water to drain from the surface of the solar panel.

2. The system of claim 1, wherein the water on the surface of the solar panel has a height of 0.5-5 cm during the activating step.

3. The system of claim 1, wherein the MEMS ultrasonic transducers emits ultrasonic waves at a frequency of 20-40 kHz during the activating step.

* * * * *